(12) United States Patent
Kim et al.

(10) Patent No.: US 9,755,183 B2
(45) Date of Patent: Sep. 5, 2017

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: Tae-Kyung Kim, Yeosu-si (KR); Sangheun Lee, Seoul (KR); Junggi Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 14/870,897

(22) Filed: Sep. 30, 2015

(65) Prior Publication Data

US 2016/0093829 A1    Mar. 31, 2016

(30) Foreign Application Priority Data

Sep. 30, 2014    (KR) .................. 10-2014-0131337

(51) Int. Cl.
*H01L 51/52*    (2006.01)
*H01L 27/32*    (2006.01)
*H01L 51/00*    (2006.01)

(52) U.S. Cl.
CPC ...... *H01L 51/5253* (2013.01); *H01L 27/3258* (2013.01); *H01L 27/3262* (2013.01); *H01L 51/0097* (2013.01); *H01L 51/5246* (2013.01); *H01L 2251/5338* (2013.01)

(58) Field of Classification Search
CPC ............ H01L 51/5253; H01L 27/3262; H01L 51/0097; H01L 51/5246; H01L 27/3258; H01L 2251/5338
See application file for complete search history.

(56) References Cited

U.S. PATENT DOCUMENTS

| | | | |
|---|---|---|---|
| 2006/0108920 A1* | 5/2006 | Yang ................... | H01L 51/5237 313/512 |
| 2008/0079360 A1 | 4/2008 | Kubota | |
| 2009/0115321 A1 | 5/2009 | Hayashi | |
| 2014/0183470 A1* | 7/2014 | Kim ................... | H01L 27/3276 257/40 |
| 2015/0349294 A1* | 12/2015 | Lee ..................... | H01L 51/5246 257/40 |
| 2016/0126498 A1* | 5/2016 | Kim ................... | H01L 51/5259 257/40 |

FOREIGN PATENT DOCUMENTS

EP    2733763 A2    5/2014

* cited by examiner

*Primary Examiner* — Roy Potter
(74) *Attorney, Agent, or Firm* — Dentons US LLP

(57) ABSTRACT

Disclosed is an organic light emitting display device that includes a foreign matter compensation layer on an inorganic layer. A passivation layer and a second inorganic layer are in direct contact with each other at the edge of the substrate. Accordingly, the number of interfaces between the inorganic layers is decreased. Thus, even if the organic light emitting display device is bent, a moisture permeation path, which may be unexpectedly formed, can be minimized.

10 Claims, 4 Drawing Sheets

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2014-0131337, filed on Sep. 30, 2014, in the Korean Intellectual Property Office, the disclosure of which is incorporated herein by reference for all purposes as if fully set forth herein.

BACKGROUND OF THE INVENTION

Field of the Invention

The present disclosure relates to an organic light emitting display device and a method for manufacturing the same. More particularly, the present disclosure relates to an organic light emitting display device with improved durability and a method for manufacturing the same.

Description of the Related Art

An organic light emitting display (OLED) is a self-light emitting display that does not need a separate light source, unlike a liquid crystal display (LCD). Thus, the OLED can be manufactured to be a lightweight and thin form. Further, the OLED is advantageous in terms of power consumption since it is driven with a low voltage. Also, the OLED has a fast response speed, a wide viewing angle, and an infinite contrast ratio. Therefore, the OLED has been recognized as a next-generation display device.

A top-emission organic light emitting display device uses a transparent electrode or a translucent electrode as a cathode in order to pass light emitted from an organic light emitting layer to an upper side.

SUMMARY OF THE INVENTION

The inventors of the present disclosure have conducted research to secure reliability of a top-emission organic light emitting display device, having an encapsulation part configured to protect the organic light emission layer against moisture, physical impact or shocks, or foreign matter which may result during a manufacturing process, formed on an organic light emitting element including an organic light emission layer configured to emit light. The inventors of the present disclosure have developed a thin film encapsulation structure having an inorganic layer for reducing a water vapor permeability (e.g., water vapor transmission rate [$g/m^2$-day; WVTR) to delay or minimize permeation of moisture and having a foreign matter compensation layer formed of an organic substance, which are alternately laminated.

In a thin film encapsulation structure, inorganic layers of various materials may be used in order to improve durability of an organic light emitting display device by minimizing water vapor permeability. For example, as a material of an inorganic layer for the thin film encapsulation structure, aluminum oxide having low water vapor permeability and an excellent step coverage may be used.

The organic light emitting display device can be realized as a flexible organic light emitting display device, but it is challenging to prevent permeation of moisture. For example, if an organic light emitting display device is bent due to its foldable or otherwise flexible form factor, adhesiveness of an interface between an inorganic layer having a thin film encapsulation structure configured to protect an organic light emitting element and a passivation layer configured to protect a thin-film transistor is decreased. Thus, the inorganic layer may be delaminated from the passivation layer by such bending action. Further, moisture may permeate into cracks or other deformations caused by delamination, which may result in damage to the organic light emitting element.

Accordingly, the inventors of the present disclosure invented an organic light emitting display device having a new structure including a plurality of inorganic layers which is capable of sufficiently maintaining the laminated interface of the thin film encapsulation structure and the passivation layer even if the organic light emitting display device is bent or flexed.

Thus, an object of the present disclosure is to provide an organic light emitting display device with improved durability and a method for manufacturing the same. The adjacent inorganic layers of the organic light emitting display device are not delaminated and a moisture permeation path is not formed or substantially minimized even if the flexible organic light emitting display device is bent or flexed, and water vapor permeability is maintained.

Another object of the present disclosure is to provide an organic light emitting display device with improved durability and a method for manufacturing the same by minimizing a moisture permeation path which can be formed by bending or flexing the organic light emitting display device.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display device. The organic light emitting display device comprises a flexible substrate having an emission area and an edge sealed area, a thin-film transistor on the flexible substrate in the emission area, a passivation layer configured to cover the flexible substrate and the thin-film transistor, an organic light emitting element configured to be connected to the thin-film transistor on the passivation layer, a first inorganic layer, a foreign matter compensation layer on the first inorganic layer, and a second inorganic layer.

The first inorganic layer is formed of a different material from the passivation layer and configured to seal the organic light emitting element such that the first inorganic layer covers the organic light emitting element at the emission area and an extended portion of the first inorganic layer is in contact with the passivation layer at an outer portion of the emission area;

The second inorganic layer is formed as a same material of the passivation layer configured to cover the foreign matter compensation layer and configured to be sealed at the edge sealed area such that the second inorganic layer is in contact with the passivation layer.

Details of certain exemplary embodiments will be included in the detailed description of the disclosure and the accompanying drawings.

The present disclosure has an effect of minimizing permeation of moisture into a delaminated part by increasing the adhesiveness between inorganic layers at an edge of an organic light emitting display device. Also, the present disclosure has an effect of minimizing delamination of the inorganic layers even if the organic light emitting display device is bent.

Also, the present disclosure can provide an organic light emitting display device with improved lifetime by minimizing permeation of moisture from a side surface (or an interface) of the flexible organic light emitting display device having a thin film encapsulation structure, and a method for manufacturing the same.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Figure 1:
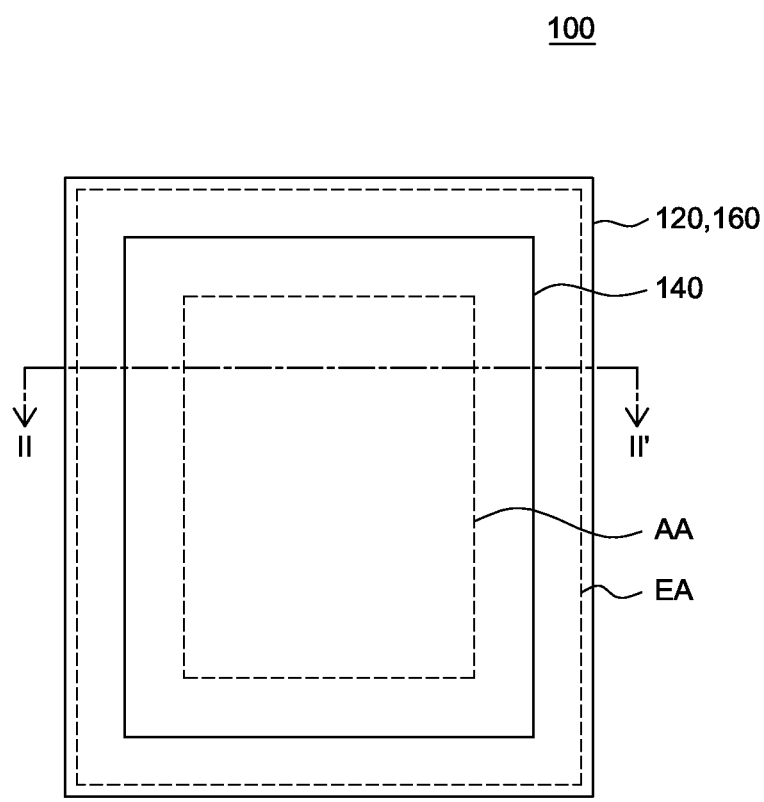
FIG. 1 is a schematic plane view of an organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "comprising", "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Figure 2:
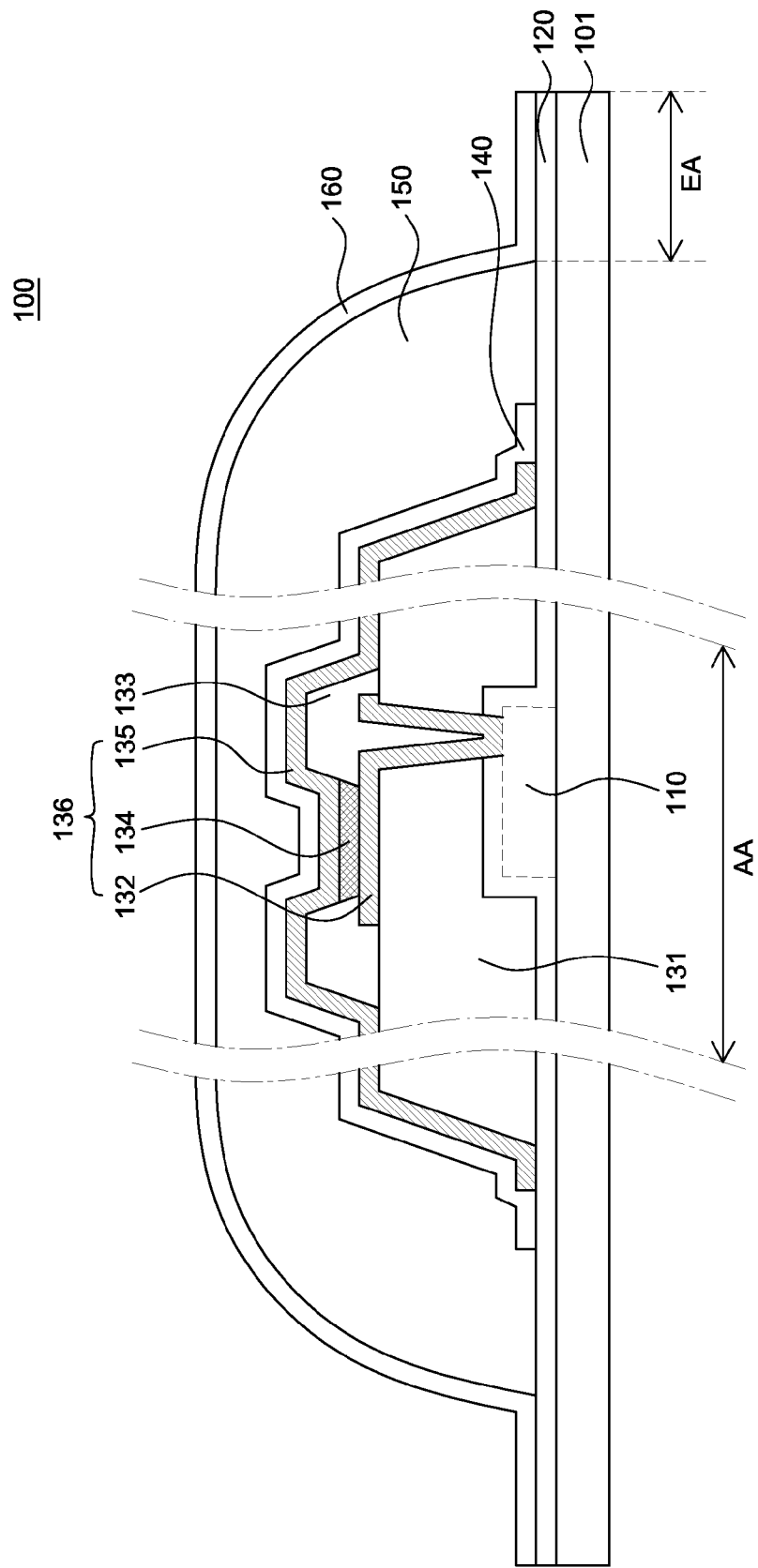
FIG. 2 is a schematic cross-sectional view of an organic light emitting display device taken along a line II-IF of FIG. 1.

FIG. 1 is a schematic plane view of an organic light emitting display device according to an exemplary embodiment of the present disclosure. FIG. 2 is a schematic cross-sectional view of an organic light emitting display device taken along a line II-II' of FIG. 1.

Referring to FIG. 1 and FIG. 2, an organic light emitting display device 100 includes a substrate 101, a thin-film transistor 110, a passivation layer 120, a planarization layer 131, an organic light emitting element 136, a first inorganic layer 140, a foreign matter compensation layer 150, and a second inorganic layer 160.

The organic light emitting display device 100 is the top-emission organic light emitting display device 100 in which a light emitted from the organic light emitting element 136 is emitted in a direction toward an upper surface of the substrate 101 on which the thin-film transistor 110 is formed.

The substrate 101 supports various elements formed on the substrate 101. Referring to FIG. 1 and FIG. 2, the substrate 101 includes an emission area AA and an edge sealed area EA. In the emission area AA, the organic light emitting element 136 is disposed. The edge sealed area EA refers to an area which is formed along an outer edge of the substrate 101 and in which the passivation layer 120 and the second inorganic layer 160 are in direct contact with each other such that an interface of the passivation layer 120 and the second inorganic layer 160 is configured to seal the foreign matter compensation layer 150 and the first inorganic layer 140 which is separated from the second inorganic layer 160. FIG. 1 illustrates that the edge sealed area EA is formed at the entire outer edge of the substrate 101, but in an area where a pad area is formed, the edge sealed area EA may be disposed between the emission area AA and the pad area rather than being disposed at the outermost edge of the substrate 101.

The substrate 101 may be formed of an insulation material. For example, the substrate 101 may be formed of a flexible material. The flexible material may include polyimide (PI), polyetherimide (PEI), polyethylene terephthalate (PET), polycarbonate (PC), polymethylmethacrylate (PMMA), polystyrene (PS), styrene-acrylonitrile copolymer (SAN), silicon-acryl resin, and the like.

The thin-film transistor 110 including an active layer, a gate electrode, a source electrode, and a drain electrode is formed on the substrate 101. The thin-film transistor 110 may adopt, without limitation, various structures such as a coplanar structure or a bottom-gate structure. The organic light emitting display device 100 may include various lines formed of the same material as the source electrode and the drain electrode, or the gate electrode.

The passivation layer 120 configured to cover the thin-film transistor 110 including the source electrode, drain electrode, and active layer. The passivation layer 120 is configured to protect the components of the thin-film transistor 110 against moisture or oxygen. Referring to FIG. 1 and FIG. 2, the passivation layer 120 is formed so as to be extended from the emission area AA toward the edge sealed area EA of the substrate 101. The passivation layer 120 may be formed on the entire surface of the substrate 101 excluding the pad area.

The passivation layer 120 is formed of any one of silicon nitride, silicon oxide, silicon oxynitride, or combinations thereof. The passivation layer 120 may be formed to have a thickness of 2 μm or less. If the thickness of the passivation layer 120 is more than 2 μm, a bending stress generated when the organic light emitting display device 100 is bent may be increased. Thus, cracks or other deformations may be more easily generated in the passivation layer 120.

The planarization layer 131 is formed on the passivation layer 120. The planarization layer 131 includes a contact hole that exposes at least a part of the drain electrode or the source electrode of the thin-film transistor 110. The planarization layer 131 is formed on the entire surface of the emission area AA and may be partially extended from the emission area AA toward the edge sealed area EA of the substrate 101.

The organic light emitting element 136 including an anode 132, an organic light emission layer 134, and a cathode 135 is formed on the planarization layer 131. The anode 132 is connected with the source electrode or the drain electrode of the thin-film transistor 110 through the contact hole of the planarization layer 131 and the passivation layer 120. A bank layer 133 is formed on both side surfaces of the anode 132 or a bank layer may be configured to surround the patterned anode 132. The bank layer 133 is formed into a taper shape.

The organic light emission layer 134 is configured to emit light and formed of an organic light emitting material for emitting light. The organic light emitting material may be a plurality of layers of organic light emitting materials for emitting a plurality of colors. The organic light emission layer 134 may be formed of materials capable of emitting various colors without limitation.

The cathode 135 is formed on the organic light emission layer 134. Since the organic light emitting display device 100 is of a top-emission type, the cathode 135 is formed of a metallic material having a low work function with very small thickness or a transparent conductive oxide (TCO). If the cathode 135 is formed of a metallic material, the cathode 135 is formed to have a thickness of several hundred Å or less. If the cathode 135 is formed to have such thickness, the cathode 135 becomes a substantially semi-transparent (or translucent) layer and thus is capable of transmitting the emitted light through the cathode 135. In this regard, the cathode 135 may be regarded as a substantially transparent layer.

The first inorganic layer 140 is formed on the cathode 135. The first inorganic layer 140 protects the organic light emission layer 134 against moisture, air, or physical impacts and shocks. Referring to FIG. 1, the first inorganic layer 140 is formed so as to surround the emission area AA. Thus, the first inorganic layer 140 is disposed so as to cover the organic light emitting element 136 and also cover the planarization layer 131 extended to the outside of the emission area AA. However, the first inorganic layer 140 is not formed on the entire surface of the substrate 101. In FIG. 1, the first inorganic layer 140 is not formed in the edge sealed area EA of the organic light emitting display device 100. Thus, even if the organic light emitting display device 100 is bent, the first inorganic layer 140 is not overlapped with the edge sealed area EA such that the edge sealed area EA is directly in contact with the passivation layer 120 and the second inorganic layer 160. Therefore, delamination of layers in contact with the first inorganic layer 140 in the edge sealed area EA can be prevented. In particular, if materials of the layers in contact with the first inorganic layer 140 are different from the material of the first inorganic layer 140, the layers in contact with the first inorganic layer 140 can be more easily delaminated from the first inorganic layer 140. Therefore, since the first inorganic layer 140 is not extended to the edge sealed area EA of the substrate 101, when the organic light emitting display device 100 is bent, the possibility of delamination between layers in the edge sealed area EA of the substrate 101 can be reduced.

The first inorganic layer 140 is configured to cover in a conformal manner on the organic light emitting element 136 which is formed with a various steps (e.g., a step corresponding to a thickness of the planarization layer 131 and a step corresponding to a thickness of the bank 133). The first inorganic layer 140 is capable of securely covering any steps of the organic light emitting element 136. Consequently, the first inorganic layer 140 can reduce cracks. Thus, permeation of moisture can be minimized. Further, the first inorganic layer 140 is formed to have a minimum thickness for reducing a bending stress applied to the flexible organic light emitting display device 100. That is, the first inorganic layer 140 is conformally formed. Furthermore, the first inorganic layer 140 is configured to maintain water vapor permeability with minimum thickness. In order to satisfy these conditions, the first inorganic layer 140 may be formed of any one of aluminum oxide, titanium oxide, zinc oxide, silicon oxide, or combinations thereof. Also, the first inorganic layer 140 may have a thickness of 200 nm or less. For example, the first inorganic layer 140 may be formed of aluminum oxide Al2O3 having a thickness of 200 nm or less.

The foreign matter compensation layer 150 is formed on the first inorganic layer 140. The foreign matter compensation layer 150 is configured to cover foreign matter or particles which occur during a process. The foreign matter or particles may cause a defect of the organic light emitting element 136 and may cause cracks in a encapsulation layer such as the first inorganic layer 140. Further, the foreign matter compensation layer 150 is relatively superior in flexibility to the first inorganic layer 140 and the second inorganic layer 160. Thus, a bending stress of the first inorganic layer 140 having lower flexibility or filling a micro crack in the first inorganic layer 140 can be reduced. Further, the foreign matter compensation layer 150 performs a function of planarizing an upper surface of the organic light emitting element 136.

The foreign matter compensation layer 150 is disposed so as to cover at least the first inorganic layer 140. Since the foreign matter compensation layer 150 is disposed so as to cover the first inorganic layer 140, the moisture tends to permeate through an interface between the first inorganic layer 140 and the foreign matter compensation layer 150 such that the interface can provide an additional moisture transferring path (e.g., guiding some moisture through the interface between the first inorganic layer 140 and the foreign matter compensation layer 150), therefore moisture permeating into the interface between the first inorganic layer 140 and the passivation layer 120, can be effectively reduced.

The foreign matter compensation layer 150 may be formed using various materials, for example, any one of a thermal curing epoxy-based resin, a UV curing epoxy-based resin, an acryl-based resin, a perylene-based resin, a polyimide-based resin, silicon oxycarbide, silicon oxide, and silicon oxynitride, or combinations thereof, but is not limited thereto. Further, the foreign matter compensation layer 150 may has a plurality of layers of different materials.

The second inorganic layer 160 is formed on the foreign matter compensation layer 150. The second inorganic layer 160 may be formed of a different material by a different method from the first inorganic layer 140. The second inorganic layer 160 also protects the organic light emission layer 134 against moisture, which may permeate from the outside, air, or a physical shock. Even if a crack is formed in the first inorganic layer 140, the second inorganic layer 160 can protect against moisture or oxygen after foreign matter is compensated by the foreign matter compensation layer 150. Further, since the inorganic layer is formed as double layers, water vapor permeability can be further reduced.

Referring to FIG. 1 and FIG. 2, the second inorganic layer 160 is in direct contact with the passivation layer 120 in the edge sealed area EA of the substrate 101. The edge sealed area EA of the substrate 101, where the passivation layer 120 is in direct contact with the second inorganic layer 160, surrounds the area where the first inorganic layer 140 is disposed. A width of the edge sealed area EA where the second inorganic layer 160 is in direct contact with the passivation layer 120 may be, for example, 300 µm or more. If the width of the edge sealed area EA is less than 300 µm, adhesiveness between the second inorganic layer 160 and the passivation layer 120 is not sufficient. Then, if the organic light emitting display device 100 is bent, the second inorganic layer 160 may be delaminated.

Since the passivation layer 120 and the second inorganic layer 160 are in direct contact with each other, the number of interfaces between the inorganic layers where delamination may easily occur is decreased as compared with a case where the first inorganic layer 140 is formed on the entire surface of the substrate 101. Thus, even if the organic light emitting display device 100 is bent, the possibility of a crack which may be formed between the passivation layer 120 and the second inorganic layer 160 and through which moisture can permeate from a side surface of the organic light emitting display device 100 can be reduced. Further, if the passivation layer 120 and the second inorganic layer 160 are formed of the same material, adhesiveness between the passivation layer 120 and the second inorganic layer 160 is greatly increased as compared with a case where the first inorganic layer 140 is formed on the entire surface of the substrate 101. Thus, the possibility of delamination of the second inorganic layer 160 from the passivation layer 120 is also reduced.

The second inorganic layer 160 may be formed of any one of silicon nitride, silicon oxide, silicon oxynitride, or combinations thereof. A material of the second inorganic layer 160 different from the first inorganic layer 140 is determined on the basis of a function of the second inorganic layer 160. The second inorganic layer 160 is not in direct contact with the organic light emitting element 136 and is positioned further outside the organic light emitting display device 100. Thus, the second inorganic layer 160 performs a slightly different function from the first inorganic layer 140, for example, a function of primarily blocking moisture introduced from the outside of the organic light emitting display device 100. Therefore, a material or thickness of the second inorganic layer 160 is determined so as to minimize delamination or cracks of the second inorganic layer 160 in the edge sealed area EA of the substrate 101. Therefore, the second inorganic layer 160 may be formed of the same material or with the same thickness as the passivation layer 120 in order to maximize adhesiveness with respect to the passivation layer 120 that is in direct contact with the second inorganic layer 160.

Further, a thickness of the passivation layer 120 and the second inorganic layer 160 may be greater than a thickness of the first inorganic layer 140. The passivation layer 120 and the second inorganic layer 160 are formed to have greater thickness than the first inorganic layer 140 for which it is important to be conformally formed. Further, if a foreign matter is introduced during a manufacturing process, the passivation layer 120 and the second inorganic layer 160 have sufficient thickness to cover the foreign matter. The thickness of the passivation layer 120 and the second inorganic layer 160 may be greater than the thickness of the first inorganic layer 140.

Moisture introduced from the side surface of the inorganic light emitting display device 100 moves particularly along an interface between the layers and moves from the edge sealed area EA near the outside toward the emission area AA. If a portion of the inorganic layer in the edge sealed area EA is delaminated from the passivation layer 120 by bending the organic light emitting display device 100, moisture moves along the interfaces between the passivation layer 120 and the foreign matter compensation layer 150. Also, moisture moves along the interfaces between the cathode 135 and the planarization layer 131 and reaches the organic emission layer 134.

However, in the organic light emitting display device 100 according to an exemplary embodiment of the present disclosure, the passivation layer 120 is in contact with the second inorganic layer 160 in the edge sealed area EA of the substrate 101, and the two layers may be formed of the same material. Therefore, adhesiveness between the two inorganic layers that the passivation layer 120 and the second inorganic layer 160, in the edge sealed area EA is improved. Therefore, even if the organic light emitting display device 100 is bent, the passivation layer 120 and the second inorganic layer 160 are not delaminated from each other but maintained as being bonded to each other. Further, since the material of the second inorganic layer 160 and the passivation layer 120 has low water vapor permeability, a movement speed of moisture permeating along the interface between the passivation layer 120 and the second inorganic layer 160 is greatly reduced.

Further, even if moisture passes through the interface between the second inorganic layer 160 and the passivation layer 120, since the first inorganic layer 140 also has an excellent step coverage and a high water vapor permeability, an amount of moisture permeating along an interface between the first inorganic layer 140 and the planarization layer 131 is greatly reduced. Therefore, an amount of moisture permeating into the organic light emission layer 134 is significantly reduced. Thus, durability of the organic light emitting display device 100 is improved.

Figure 3:
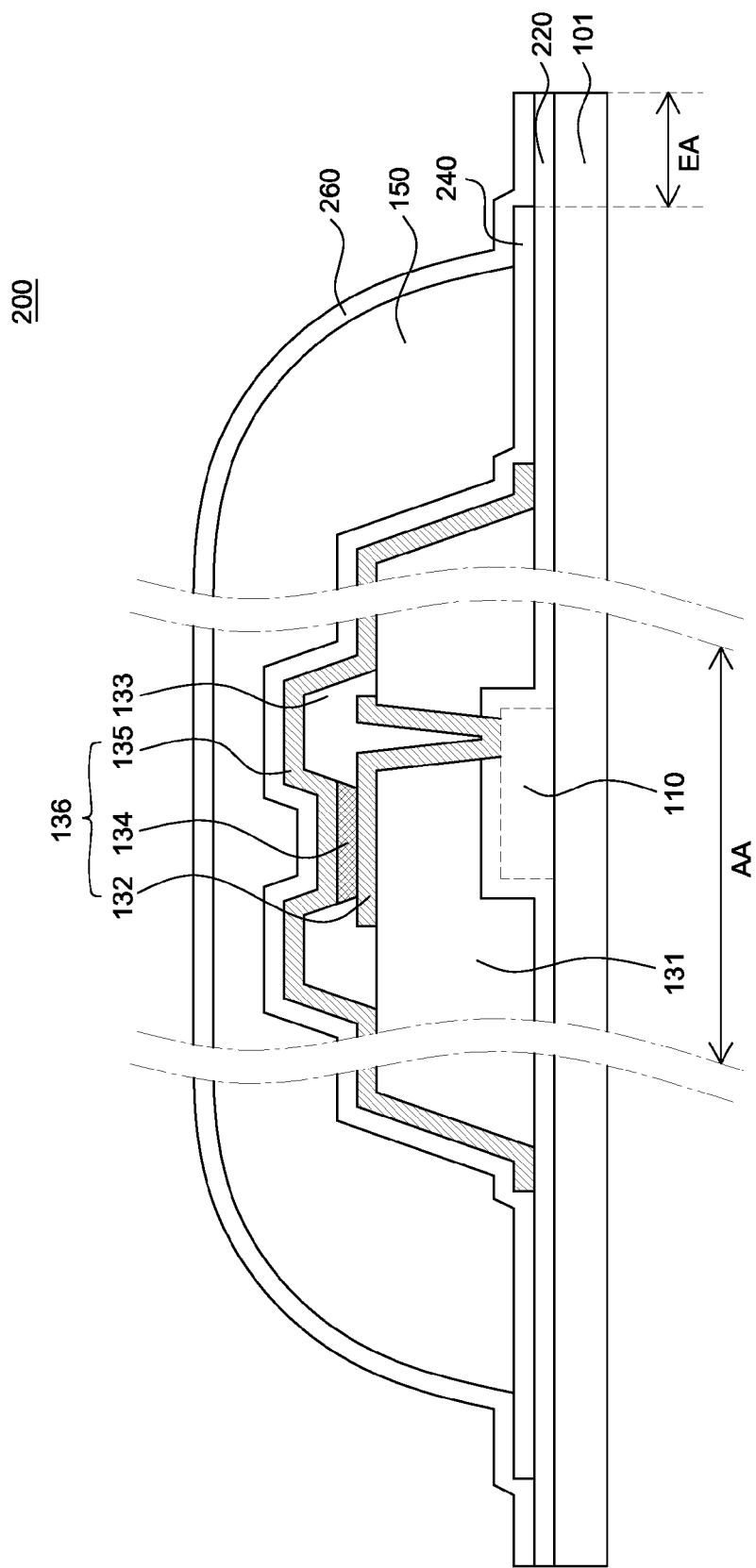
FIG. 3 is a schematic cross-sectional view of an organic light emitting display device according to another exemplary embodiment of the present disclosure.

FIG. 3 is a schematic cross-sectional view of an organic light emitting display device according to another exemplary embodiment of the present disclosure. A configuration illustrated in FIG. 3 is substantially the same as the configuration as illustrated in the cross-sectional view in FIG. 2 except that a portion of a first inorganic layer 240 is interposed between a passivation layer 220 and a second inorganic layer 260. Thus, redundant descriptions thereof will be omitted.

A portion of the first inorganic layer 240 is interposed between the passivation layer 220 and the second inorganic layer 260 so as to be in direct contact with the passivation layer 220 and the second inorganic layer 260. In an organic light emitting display device 200 of FIG. 3, the first inorganic layer 240 is further extended toward the edge sealed area EA than the first inorganic layer 140 in FIG. 2. Therefore, a distance from an end of the first inorganic layer 240 to the organic light emission layer 134 is increased. Thus, a time needed for permeating moisture from the outside to the organic light emission layer 134 may be increased. Therefore, a life of the organic light emitting element 136 may be increased.

The first inorganic layer 240 may be formed of a different material from the passivation layer 220 or the second inorganic layer 260. In this case, in an area where the first inorganic layer 240 is interposed between the passivation layer 220 and the second inorganic layer 260, the passivation layer 220 and the second inorganic layer 260 can be easily delaminated from the first inorganic layer 240. Therefore, if the first inorganic layer 240 is interposed between the passivation layer 220 and the second inorganic layer 260, the edge sealed area EA where the passivation layer 220 and the second inorganic layer 260 are in direct contact with each other needs to be sufficiently secured. This is for the passivation layer 220 and the second inorganic layer 260 not to be delaminated from each other in the edge sealed area EA. For example, a width of the edge sealed area EA may be 300 $\mu$m or more.

Figure 4:
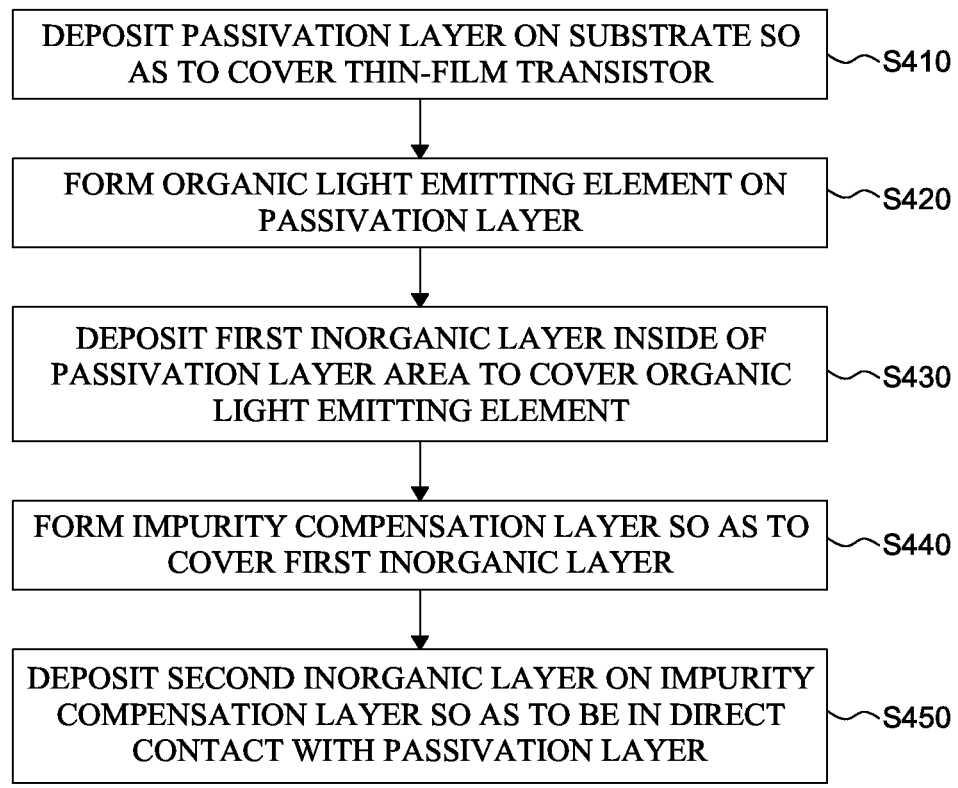
FIG. 4 is a flowchart provided to explain a method for manufacturing an organic light emitting display device according to an exemplary embodiment of the present disclosure.

FIG. 4 is a flowchart provided to explain a method for manufacturing an organic light emitting display device according to an exemplary embodiment of the present disclosure.

Firstly, a passivation layer is deposited on a substrate so as to cover a thin-film transistor (S410). The passivation layer is formed on the entire surface of the substrate and formed of any one of, for example, silicon nitride, silicon oxide, silicon oxynitride, or combinations thereof. The passivation layer may be formed by chemical vapor deposition so as to have a thickness of 2 $\mu$m or less.

Then, an organic light emitting element is formed on the passivation layer (S420). The organic light emitting element is formed using a typical non-limiting preparation method. A first inorganic layer is deposited so as to cover the organic light emitting element inside an area where the passivation layer is formed (S430). The first inorganic layer may be formed by a different method from a deposition method of the passivation layer and the second inorganic layer. For example, the first inorganic layer may be formed by atomic layer deposition. Further, the first inorganic layer may be formed of any one of aluminum oxide, titanium oxide, zinc oxide, silicon oxide, or combinations thereof. Furthermore, the first inorganic layer may have a thickness of 200 nm or less.

The first inorganic layer may be formed only on a partial area of the substrate by atomic layer deposition in a state where a mask opened corresponding to the organic light emitting element and a planarization layer under the organic light emitting element is disposed.

Then, a foreign matter compensation layer is formed so as to cover the first inorganic layer (S440). The foreign matter compensation layer is coated by screen printing. The foreign matter compensation layer is coated by disposing a material of the foreign matter compensation layer on a mesh-shaped plate having tension and pushing the material of the foreign matter compensation layer on a flexible substrate on which the organic light emitting element is formed by a squeezer on the plate.

A second inorganic layer is deposited on the foreign matter compensation layer (S450). The second inorganic layer may be deposited by the same method as the passivation layer. For example, the second inorganic layer may also be deposited by chemical vapor deposition. Further, the second inorganic layer may be formed of the same material as the passivation layer. Also, the passivation layer and the second inorganic layer are in direct contact with each other in an edge sealed area of the substrate.

Since the passivation layer and the second inorganic layer are in direct contact with each other in the edge sealed area of the substrate and particularly, the passivation layer and the second inorganic layer are formed of the same material, adhesiveness between the passivation layer and the second inorganic layer in the edge sealed area of the substrate is increased. Thus, even if the organic light emitting display device is bent, delamination of the second inorganic layer from the passivation layer is reduced. As a result, the method for manufacturing an organic light emitting display device according to an exemplary embodiment of the present disclosure can provide an organic light emitting display device with improved durability in which water vapor permeability is maintained even if the flexible organic light emitting display device is bent.

In the present specification, it has been described that the foreign matter compensation layer is coated by screen printing, but is not limited thereto. The foreign matter compensation layer may be coated by various methods for coating a curing material, such as spin coating, or slit coating. Further, it has been described that the passivation layer, the first inorganic layer, and the second inorganic layer are formed by atomic layer deposition or chemical vapor deposition, but are not limited thereto, and may be formed by various deposition methods such as plasma-enhanced chemical vapor deposition.

The exemplary embodiments of the present disclosure can also be described as follows:

According to another feature of the present disclosure, the first inorganic layer is covered by the foreign matter compensation layer and separated from the second inorganic layer by the foreign matter compensation layer.

According to yet another feature of the present disclosure, a portion of the first inorganic layer is interposed between the passivation layer and the second inorganic layer so as to be in direct contact with the passivation layer and the second inorganic layer.

According to yet another feature of the present disclosure, an edge of the substrate where the passivation layer and the second inorganic layer are in direct contact with each other surrounds an area where the first inorganic layer is disposed.

According to yet another feature of the present disclosure, the passivation layer and the second inorganic layer are formed of any one of silicon nitride, silicon oxide, silicon oxynitride, or combinations thereof.

According to yet another feature of the present disclosure, a thickness of the passivation layer is greater than a thickness of the first inorganic layer and a thickness of the second inorganic layer is greater than a thickness of the first inorganic layer.

According to yet another feature of the present disclosure, the first inorganic layer is formed of any one of aluminum oxide, titanium oxide, zinc oxide, silicon oxide, or combinations thereof.

According to yet another feature of the present disclosure, the first inorganic layer is formed of aluminum oxide having a thickness of 200 nm or less.

According to yet another feature of the present disclosure, the foreign matter compensation layer has a plurality of layers of different materials.

According to yet another feature of the present disclosure, adhesiveness between the first inorganic layer and the second inorganic layer is greater than adhesiveness between the foreign matter compensation layer and one of the first inorganic layer and the second inorganic layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
    a flexible substrate having an emission area and an edge sealed area;
    a thin-film transistor on the flexible substrate in the emission area;
    a passivation layer configured to cover the flexible substrate and the thin-film transistor;
    an organic light emitting element configured to be connected to the thin-film transistor on the passivation layer;
    a first inorganic layer formed of a different material from the passivation layer and configured to seal the organic light emitting element such that the first inorganic layer covers the organic light emitting element at the emission area, and an extended portion of the first inorganic layer is in contact with the passivation layer at an outer portion of the emission area;
    a foreign matter compensation layer on the first inorganic layer; and
    a second inorganic layer formed of a same material as the passivation layer configured to cover the foreign matter compensation layer, and configured to be sealed at the edge sealed area such that the second inorganic layer is in contact with the passivation layer.

2. The organic light emitting display device according to claim 1, wherein the first inorganic layer is covered by the foreign matter compensation layer and separated from the second inorganic layer by the foreign matter compensation layer.

3. The organic light emitting display device according to claim 1, wherein a portion of the first inorganic layer is interposed between the passivation layer and the second inorganic layer so as to be in direct contact with the passivation layer and the second inorganic layer.

4. The organic light emitting display device according to claim 1, wherein an edge of the substrate where the passivation layer and the second inorganic layer are in direct contact with each other surrounds an area where the first inorganic layer is disposed.

5. The organic light emitting display device according to claim 1, wherein the passivation layer and the second inorganic layer are formed of any one of silicon nitride, silicon oxide, silicon oxynitride, or combinations thereof.

6. The organic light emitting display device according to claim 5, wherein a thickness of the passivation layer is greater than a thickness of the first inorganic layer, and a thickness of the second inorganic layer is greater than a thickness of the first inorganic layer.

7. The organic light emitting display device according to claim 5, wherein the first inorganic layer is formed of any one of aluminum oxide, titanium oxide, zinc oxide, silicon oxide, or combinations thereof.

8. The organic light emitting display device according to claim 7, wherein the first inorganic layer is formed of aluminum oxide having a thickness of 200 nm or less.

9. The organic light emitting display device according to claim 1, wherein the foreign matter compensation layer has a plurality of layers of different materials.

10. The organic light emitting display device according to claim 1, wherein adhesiveness between the first inorganic layer and the second inorganic layer is greater than adhesiveness between the foreign matter compensation layer and one of the first inorganic layer and the second inorganic layer.

* * * * *